(12) United States Patent
Lu et al.

(10) Patent No.: US 7,875,926 B2
(45) Date of Patent: Jan. 25, 2011

(54) NON-VOLATILE MEMORY CELL

(75) Inventors: Chi-Pin Lu, Hsinchu (TW); Shing-Ann Luo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 12/785,698

(22) Filed: May 24, 2010

(65) Prior Publication Data
US 2010/0252878 A1 Oct. 7, 2010

Related U.S. Application Data

(62) Division of application No. 11/774,381, filed on Jul. 6, 2007, now Pat. No. 7,749,838.

(51) Int. Cl.
*H01L 29/792* (2006.01)
*H01L 21/336* (2006.01)

(52) U.S. Cl. ........................................ 257/324; 438/261

(58) Field of Classification Search .................. 257/316, 257/324, 406, E29.309; 438/260–261
See application file for complete search history.

(56) References Cited

U.S. PATENT DOCUMENTS

| 6,858,906 B2* | 2/2005 | Lee et al. ..................... 257/406 |
| 7,749,838 B2* | 7/2010 | Lu et al. ..................... 438/261 |
| 2006/0071301 A1 | 4/2006 | Luo et al. ..................... 257/632 |
| 2006/0246661 A1 | 11/2006 | Joo et al. ..................... 438/257 |

FOREIGN PATENT DOCUMENTS

TW  I253169  4/2006

OTHER PUBLICATIONS

Chinese Examination Report of Taiwan Application No. 096121488, dated on Sep. 6, 2010.

* cited by examiner

*Primary Examiner*—Calvin Lee
(74) *Attorney, Agent, or Firm*—J.C. Patents

(57) ABSTRACT

A super-silicon-rich oxide (SSRO) non-volatile memory cell includes a gate conductive layer on a substrate, a source/drain in the substrate at respective sides of the gate conductive layer, a tunneling dielectric layer between the gate conductive layer and the substrate, a SSRO layer serving as a charge trapping layer between the gate conductive layer and the tunneling dielectric layer, and an upper-dielectric layer between the gate conductive layer and the SSRO layer.

27 Claims, 4 Drawing Sheets

NON-VOLATILE MEMORY CELL

CROSS-REFERENCE TO RELATED APPLICATION

This application is a divisional application of and claims the priority benefit of an application Ser. No. 11/774,381, filed on Jul. 6, 2007, now allowed. The entirety of the above-mentioned patent application is hereby incorporated by reference herein and made a part of this specification.

BACKGROUND OF THE INVENTION

1. Field of the Invention

The present invention relates to a memory cell. More particularly, the present invention relates to a non-volatile memory.

2. Description of Related Art

Recently, demands on electrical consumers are increasing. Most of the electrical consumers including digital cameras, MP3 players, laptop computers and personal digital assistants (PDAs) require read-only memories (ROMs) for storing a great deal of data. Since information or the data stored in the ROM are not volatiled even though the power is off, the ROM is also called a non-volatile memory. The most common ROM goes to an electrically erasable programmable ROM (EEPROM) which is not only capable of reading and writing but also allows multiple programming and erasing operations.

The typical EEPROM adopts doped polysilicon as a control gate and a floating gate. During a programming operation performed on the EEPROM, electrons injected into the floating gate may be distributed over the whole doped polysilicon floating gate layer in a uniform manner. However, when there are defects in a tunneling oxide layer under the doped polysilicon floating gate layer, current leakage of the device may occur, and the reliability of the device is adversely affected.

Currently, the issue of current leakage occurring in the EEPROM may be resolved with use of a certain device. This device employs a charge trapping layer as a replacement for the doped polysilicon floating gate layer. Since the charge trapping layer is made of a material characterized by capturing the electrons, the electrons injected into the charge trapping layer are not uniformly distributed over the charge trapping layer. Instead, the electrons with a Gaussian distribution property are collected in partial areas of the charge trapping layer. Since the electrons injected into the charge trapping layer are merely concentrated in the partial areas, said charge trapping layer has little sensitivity to the defects of the tunneling oxide layer, thus lessening the current leakage of the device. Typically, the material of the charge trapping layer is silicon nitride. The charge trapping layer made of silicon nitride is normally sandwiched between a top silicon oxide layer and a bottom silicon oxide layer to form a stacked gate structure including a silicon oxide/silicon nitride/silicon oxide (ONO) composite dielectric layer. The EEPROM having said stacked gate structure is frequently referred to as a silicon nitride ROM. However, the number of the charges captured by the charge trapping layer made of silicon nitride and the capturing speed of the charge trapping layer are not quite impressive.

SUMMARY OF THE INVENTION

The present invention is directed to a non-volatile memory cell which is able to increase the number of charges captured by a charge trapping layer.

The present invention is further directed to a non-volatile memory cell which is capable of increasing the capturing speed achieved by the charge trapping layer.

The present invention provides a super-silicon-rich oxide (SSRO) non-volatile memory cell including a substrate, a gate conductive layer, a source/drain, a tunneling dielectric layer, a SSRO layer, and an upper-dielectric layer. The gate conductive layer is disposed on the substrate. The source/drain is disposed in the substrate at respective sides of the gate conductive layer. The tunneling dielectric layer is disposed between the gate conductive layer and the substrate. The SSRO layer serving as a charge trapping layer is disposed between the gate conductive layer and the tunneling dielectric layer. The upper-dielectric layer is disposed between the gate conductive layer and the SSRO layer.

According to an embodiment of the present invention, a refractive index at 248 nm wave length of the SSRO layer ranges from 1.7 to 2.

According to an embodiment of the present invention, the refractive index at 248 nm wave length of the SSRO layer is 1.7.

According to an embodiment of the present invention, a material of the upper-dielectric layer is silicon oxide.

According to an embodiment of the present invention, a thickness of the SSRO layer ranges from 80 angstroms to 120 angstroms.

According to an embodiment of the present invention, a thickness of the upper-dielectric layer ranges from 70 angstroms to 110 angstroms.

According to an embodiment of the present invention, the tunneling dielectric layer is a tunneling oxide layer and a thickness of the tunneling oxide layer ranges from 40 angstroms to 50 angstroms.

According to an embodiment of the present invention, the tunneling dielectric layer comprises a bottom oxide layer, a nitride layer and a top oxide layer from bottom to top formed between the SSRO layer and the substrate.

According to an embodiment of the present invention, a thickness of the bottom oxide layer is less than 20 angstroms.

According to an embodiment of the present invention, a thickness of the bottom oxide layer ranges from 5 angstroms to 20 angstroms.

According to an embodiment of the present invention, a thickness of the bottom oxide layer is less than 15 angstroms.

According to an embodiment of the present invention, a thickness of the nitride layer is less than 20 angstroms.

According to an embodiment of the present invention, a thickness of the nitride layer ranges from 10 angstroms to 20 angstroms.

According to an embodiment of the present invention, a thickness of the top oxide layer is less than 20 angstroms.

According to an embodiment of the present invention, a thickness of the top oxide layer ranges from 15 angstroms to 20 angstroms.

The present invention further provides a cluster non-volatile memory cell including a substrate, a gate conductive layer, a source/drain, a tunneling dielectric layer, a charge trapping layer, and an upper-dielectric layer. The gate conductive layer is disposed on the substrate. The source/drain is disposed in the substrate at respective sides of the gate conductive layer. The tunneling dielectric layer is disposed between the gate conductive layer and the substrate. The charge trapping layer is disposed between the gate conductive layer and the tunneling dielectric layer. Besides, the charge trapping layer is an insulating layer, and a plurality of clusters are disposed in the insulating layer. The upper-dielectric layer is disposed between the gate conductive layer and the charge trapping layer.

According to an embodiment of the present invention, a material of the insulating layer includes silicon oxide, and the clusters are made of silicon atoms.

According to an embodiment of the present invention, a refractive index at 248 nm wave length of the charge trapping layer ranges from 1.7 to 2.

According to an embodiment of the present invention, the refractive index at 248 nm wave length of the charge trapping layer is 1.7.

According to an embodiment of the present invention, a material of the upper-dielectric layer is silicon oxide.

According to an embodiment of the present invention, a thickness of the SSRO layer ranges from 80 angstroms to 120 angstroms.

According to an embodiment of the present invention, a thickness of the upper-dielectric layer ranges from 70 angstroms to 110 angstroms.

According to an embodiment of the present invention, the tunneling dielectric layer is a tunneling oxide layer and a thickness of the tunneling oxide layer ranges from 40 angstroms to 50 angstroms.

According to an embodiment of the present invention, the tunneling dielectric layer comprises a bottom oxide layer, a nitride layer and a top oxide layer from bottom to top formed between the SSRO layer and the substrate.

According to an embodiment of the present invention, a thickness of the bottom oxide layer is less than 20 angstroms.

According to an embodiment of the present invention, a thickness of the bottom oxide layer ranges from 5 angstroms to 20 angstroms.

According to an embodiment of the present invention, a thickness of the bottom oxide layer is less than 15 angstroms.

According to an embodiment of the present invention, a thickness of the nitride layer is less than 20 angstroms.

According to an embodiment of the present invention, a thickness of the nitride layer ranges from 10 angstroms to 20 angstroms.

According to an embodiment of the present invention, a thickness of the top oxide layer is less than 20 angstroms.

According to an embodiment of the present invention, a thickness of the top oxide layer ranges from 15 to 20 angstroms.

In the present invention, the cluster-containing oxide layer such as the SSRO layer is utilized as the charge trapping layer of the non-volatile memory cell. Thereby, the number of the charges captured by the charge trapping layer of the non-volatile memory cell can be increased, and the capturing speed achieved by the charge trapping layer can be raised.

In order to make the aforementioned and other features and advantages of the present invention more comprehensible, several embodiments accompanied with figures are described in detail below.

DESCRIPTION OF EMBODIMENTS

Figure 1A:
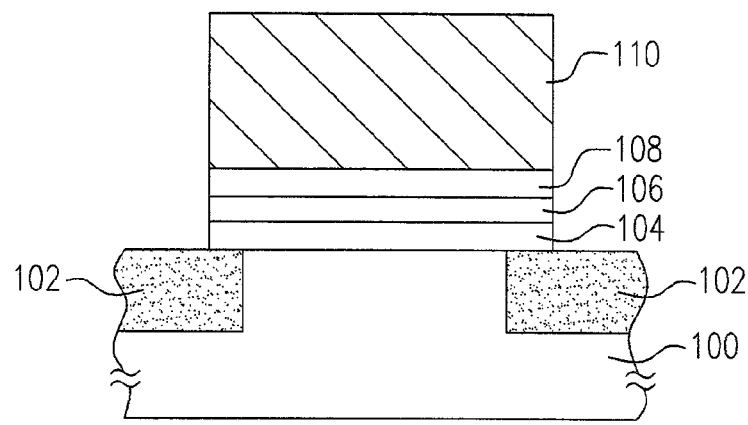
FIG. 1A is a cross-sectional schematic view illustrating a SSRO non-volatile memory cell according to an embodiment of the present invention.
Figure 1B:
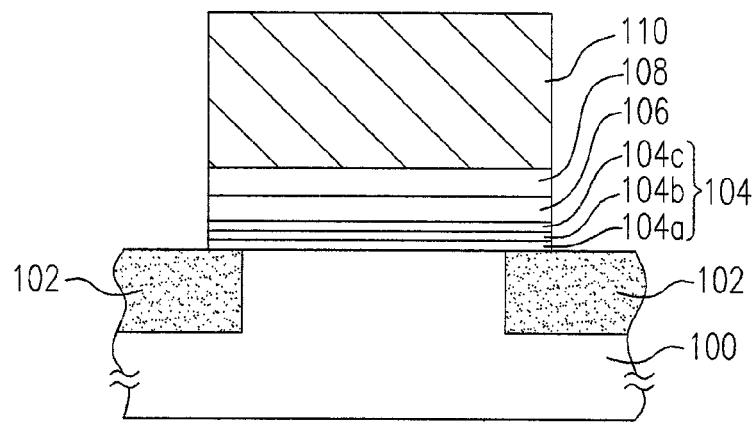
FIG. 1B is a cross-sectional schematic view illustrating a SSRO non-volatile memory cell according to another embodiment of the present invention.

Please refer to FIGS. 1A and 1B which are a cross-sectional schematic view illustrating a SSRO non-volatile memory cell according to an embodiment of the present invention, respectively.

Referring to FIGS. 1A and 1B, the non-volatile memory cell includes a substrate 100, doped regions 102, a tunneling dielectric layer 104, a SSRO layer 106, an upper-dielectric layer 108, and a gate conductive layer 110. The substrate 100 may be, for example, a silicon substrate. Dopants in the substrate 100 include N-type dopants or P-type dopants. The doped regions 102 serve as a source/drain, and the dopants therein can be classified into the N-type dopants or the P-type dopants. In one embodiment, the dopants in the substrate 100 are the P-type dopants, while the dopants in the doped regions 102 are the N-type dopants. Contrarily, in another embodiment, the dopants in the substrate 100 are the N-type dopants, while the dopants in the doped regions 102 are the P-type dopants.

The tunneling dielectric layer 104 is disposed on the substrate 100 between the doped regions 102. In an embodiment, the tunneling dielectric layer 104 is a tunneling oxide layer, for example, a silicon oxide layer, and a thickness thereof ranges from 40 angstroms to 50 angstroms, for example, as shown in FIG. 1A. In another embodiment, tunneling dielectric layer 104 comprises a bottom oxide layer 104a, a nitride layer 104b and a top oxide layer 104c from bottom to top formed on the substrate 100 as shown in FIG. 1B. The materials of the bottom oxide layer 104a and the top oxide layer 104c include silicon oxide, for example. The material of the nitride layer 104b includes silicon nitride. In an embodiment, a thickness of the bottom oxide layer 104a is less than 20 angstroms. In the other embodiment, a thickness of the bottom oxide layer 104a ranges from 5 angstroms to 20 angstroms. In another embodiment, a thickness of the bottom oxide layer 104a is less than 150 angstroms. In an embodiment, a thickness of the nitride layer 104b is less than 20 angstroms. In an embodiment, thickness of the nitride layer 104b ranges from 10 to 20 angstroms. In an embodiment, a thickness of the top oxide layer 104c ranges from 15 to 20 angstroms. The following descriptions use a tunneling dielectric layer 104 constituted of a single layer as shown in FIG. 1A.

Figure 2:
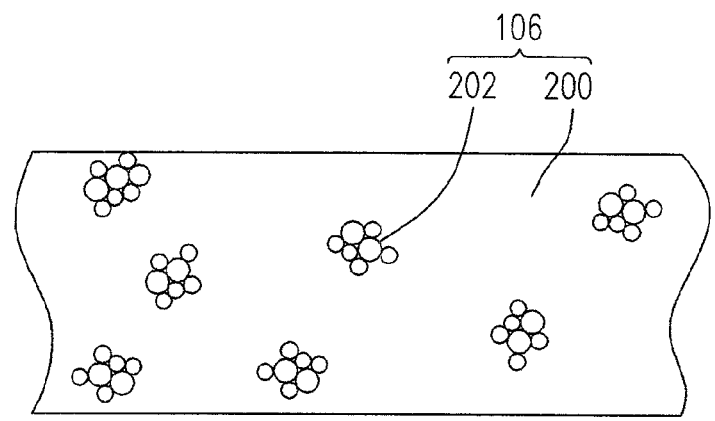
FIG. 2 is an enlarged partial schematic view of the SSRO layer in FIG. 1.

The SSRO layer 106 serving as a charge trapping layer is disposed on the tunneling dielectric layer 104. For better demonstration, an enlarged partial schematic view of the SSRO layer 106 is depicted in FIG. 2. Referring to FIG. 2, the SSRO layer 106 includes an oxide layer 200 having a plurality of cluster 202 of silicon atoms. As the memory cell is programmed, charges can be stored in the cluster 202 of the silicon atoms. In one embodiment, a refractive index at 248 nm wave length of the SSRO layer 106 ranges from 1.7 to 2. In another embodiment, the refractive index at 248 nm wave length of the SSRO layer 106 is 1.7. A thickness of the SSRO layer 106 ranges from 80 angstroms to 120 angstroms, for example.

The upper-dielectric layer 108 is disposed on the SSRO layer 106. In an embodiment, a material of the upper-dielectric layer 108 is silicon oxide, and a thickness thereof ranges from 70 angstroms to 110 angstroms. The gate conductive layer 110 is disposed on the upper-dielectric layer 108. In an embodiment, the gate conductive layer 110 is a doped polysilicon layer. However, in another embodiment, the gate conductive layer 110 is constructed by a doped polysilicon layer and a silicide layer.

FIGS. 3A through 3E are cross-sectional schematic views illustrating a process of fabricating a SSRO non-volatile memory cell according to an embodiment of the present invention.

Figure 3A:
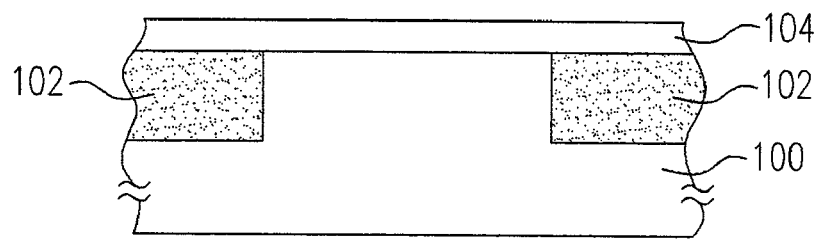
FIGS. 3A through 3E are cross-sectional schematic views illustrating a process of fabricating a SSRO non-volatile memory cell according to an embodiment of the present invention.
Figure 3A:
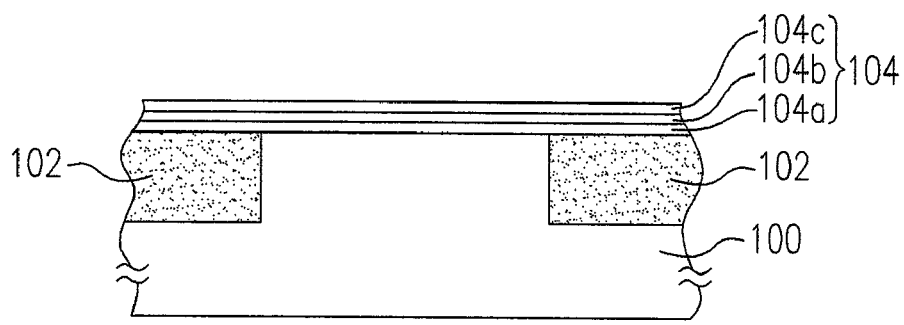

First, referring to FIG. 3A, a substrate 100, for example, a silicon substrate, is provided. Dopants in the silicon substrate 100 include N-type dopants or P-type dopants. Two doped regions 102 are then formed on the substrate 100 as a source/drain. A method of forming the doped regions 102 may be a thermal diffusion method or an ion implantation method, for example. The dopants in the doped regions 102 may be the N-type dopants or the P-type dopants. In an embodiment, the dopants in the substrate 100 are the P-type dopants, while the dopants in the doped regions 102 are the N-type dopants. Contrarily, in another embodiment, the dopants in the substrate 100 are the N-type dopants, while the dopants in the doped regions 102 are the P-type dopants.

Then, a tunneling dielectric layer 104 is formed on the substrate 100. In an embodiment, the tunneling dielectric layer 104 is a tunneling oxide layer as shown in FIG. 3A. The tunneling oxide layer is made of, for example, silicon oxide, and is formed by performing a thermal oxidation process. A thickness of the tunneling dielectric layer 104 ranges from 40 angstroms to 50 angstroms.

Referring to FIG. 3AA, in another embodiment, the tunneling dielectric layer 104 comprises a bottom oxide layer 104a, a nitride layer 104b and a top oxide layer 104c from bottom to top formed on the substrate 100. The bottom oxide layer 104a is formed by a thermal oxidation process, for example. The nitride layer 104b is form by a CVD process, for example. The top oxide layer 104c is formed by a CVD process, for example. The following processes are described using a tunneling dielectric layer 104 constituted of a single layer as shown in FIG. 3A.

Figure 3B:
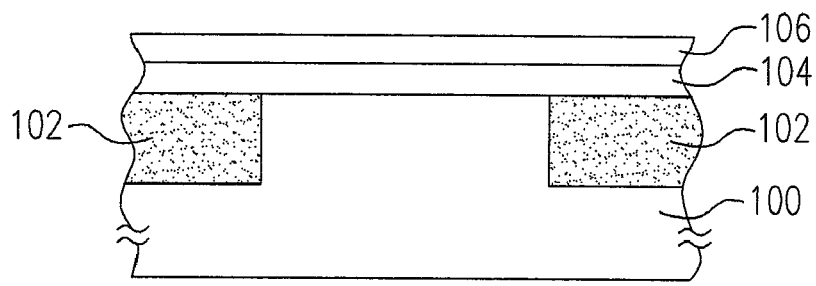

After that, referring to FIG. 3B, a SSRO layer 106 is formed on the tunneling oxide layer 104. The enlarged partial schematic view of the SSRO layer 106 is depicted in FIG. 2. Referring to FIG. 2, the SSRO layer 106 includes an oxide layer 200 having a plurality of cluster 202 of silicon atoms. As the memory cell is programmed, charges can be stored in the cluster 202 of the silicon atoms. In an embodiment, a refractive index at 248 nm wave length of the SSRO layer 106 ranges from 1.7 to 2. In another embodiment, the refractive index at 248 nm wave length of the SSRO layer 106 is 1.7. Besides, in one embodiment, a thickness of the SSRO layer 106 ranges from 80 angstroms to 120 angstroms, and the SSRO layer 106 is formed by performing a PECVD process, such that the silicon oxide layer 200 is formed, and a plurality of the cluster 202 of the silicon atoms is simultaneously formed in the silicon oxide layer 200. In an embodiment, the SSRO layer 106 is formed by performing the PECVD process at a temperature ranging from 350° C. to 450° C., a pressure ranging from 2.5 torr to 8.5 torr and a high-frequency power ranges from 100 W to 130 W. The reaction gas for implementing the PECVD process includes $N_2O$ and $SiH_4$. A flow ratio of $N_2O$ to $SiH_4$ is between 0.5 and 1. A flow rate of $N_2O$ ranges from 80 sccm to 100 sccm, while a flow rate of $SiH_4$ ranges from 160 sccm to 170 sccm, for example. In one embodiment, the PECVD process is implemented at the temperature of 400° C. and at the pressure of 5.5 torr. Here, the flow ratio of $N_2O$ to $SiH_4$ is 0.57, a flow rate of $N_2O$ and that of $SiH_4$ are 90 sccm and 168 sccm, respectively, and the high-frequency power provided through the implementation of the PECVD process is 120 W.

Figure 3C:
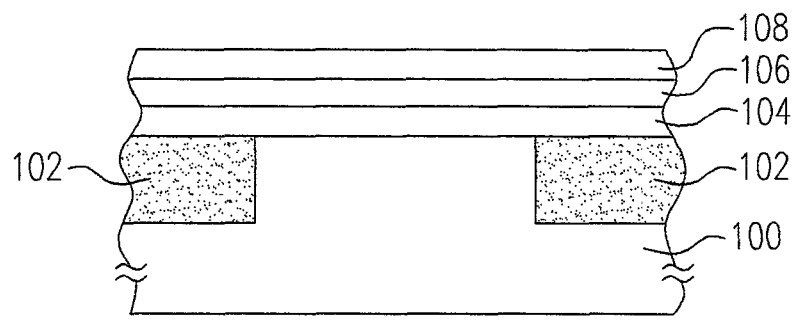

Thereafter, as shown in FIG. 3C, an upper-dielectric layer 108 is formed on the SSRO layer 106. A material of the upper-dielectric layer 108 is, for example, silicon oxide, and the upper-dielectric layer 108 is formed by performing a low pressure chemical vapor deposition (LPCVD) method, for example. In one embodiment, a thickness of the upper-dielectric layer 108 ranges from 70 angstroms to 110 angstroms.

Figure 3D:
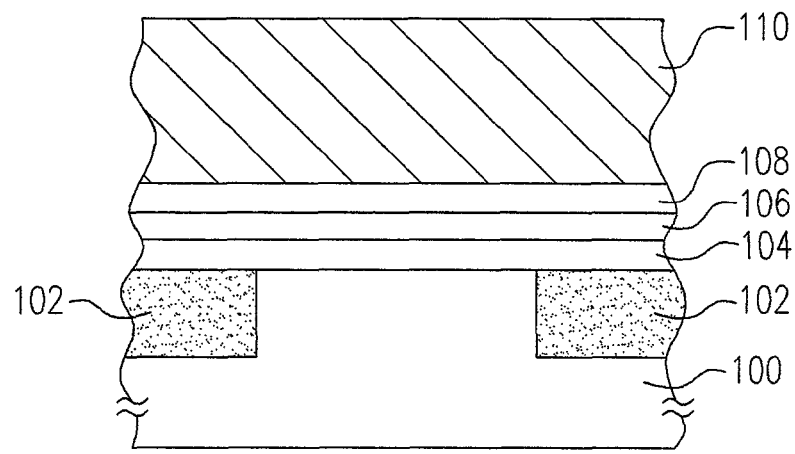

Next, referring to FIG. 3D, a gate conductive layer 110 is formed on the upper-dielectric layer 108. In one embodiment, the gate conductive layer 110 is a doped polysilicon layer and is formed by adopting an in-situ operation in a chemical vapor deposition (CVD) process. In another embodiment, the gate conductive layer 110 is constructed by one doped polysilicon layer and a silicide layer. In addition, the gate conductive layer 110 is formed by firstly adopting the in-situ operation in a CVD process, such that the doped polysilicon layer is formed. Thereafter, another CVD process is performed for forming the silicide layer.

Figure 3E:
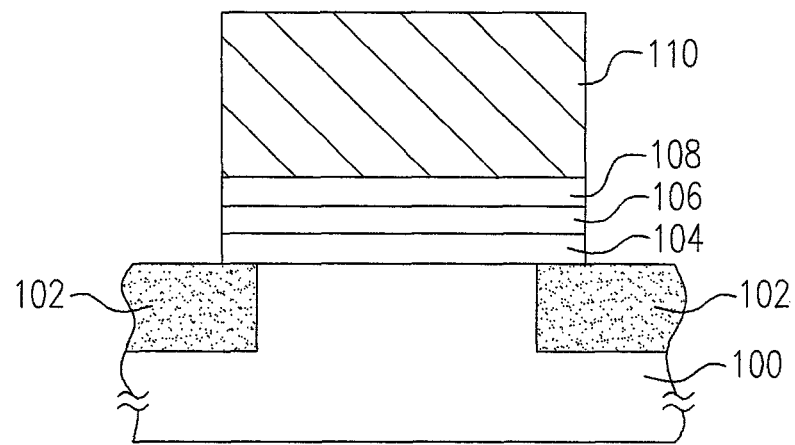

Afterwards, referring to FIG. 3E, a patterning process is carried out to form a patterned photoresist layer (not shown) on the gate conductive layer 110. In addition, a portion of the gate conductive layer 110, the upper-dielectric layer 108, the SSRO layer 106 and the tunneling dielectric layer 104 are removed with use of the patterned photoresist layer as a mask, such that a surface of the substrate is exposed by areas uncovered by the photoresist layer. Eternally, the photoresist layer is removed. A method for removing the portion of the gate conductive layer 110, the upper-dielectric layer 108, the SSRO layer 106 and the tunneling dielectric layer 104 is, for example, a dry etching method. On the other hand, a method of removing the photoresist layer is, for example, conducting a wet etching method with use of $H_2SO_4$ solution or the like to strip the photoresist layer.

According to the above embodiments, the doped regions serving as the source/drain are firstly formed, and a gate structure is subsequently constructed. However, the present invention is not limited thereto. The doped regions serving as the source/drain may also be formed after the formation of the gate structure.

Figure 4:
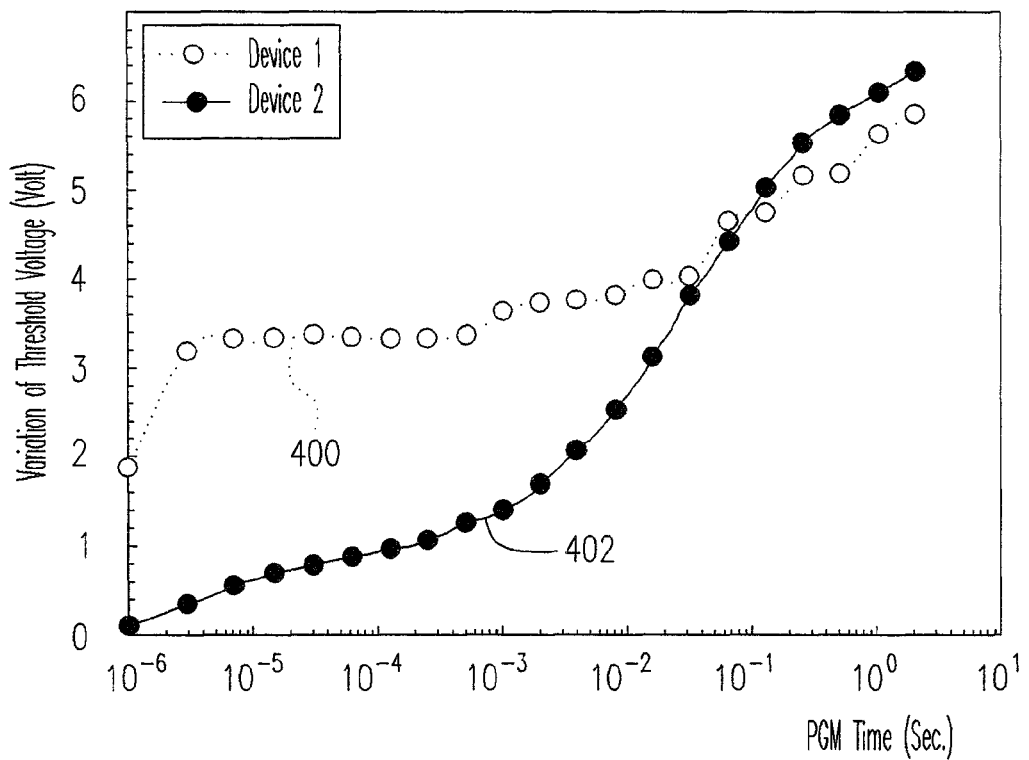
FIG. 4 is a curve diagram illustrating experimental results with respect to a relation between a programming (PGM) time and a variation of a corresponding threshold voltage ($\Delta V_T$) in a conventional silicon nitride device and that in a SSRO device according to the present invention.

FIG. 4 is a curve diagram illustrating a relation between a PGM time and a variation of a corresponding threshold voltage ($\Delta V_T$) in a conventional silicon nitride device and that in a SSRO device according to the present invention.

A curve 400 represents a relation between the PGM time and the corresponding $\Delta V_T$ in the SSRO device (referring to as "device 1" hereinafter). The device 1 is constructed by a tunneling dielectric layer formed on a silicon substrate and having a thickness of 48 angstroms, a SSRO layer having a thickness of 100 angstroms and a refractive index at 248 nm wave length of __1.7, a silicon oxide dielectric layer having a thickness of 90 angstroms, and a doped polysilicon gate. During the programming operation, a negative Fowler-Nordheim (−FN) programming is conducted by applying a −18V voltage to the doped polysilicon gate.

A curve 402 represents the relation between the PGM time and the corresponding $\Delta V_T$ in the conventional silicon nitride device (referring to as "device 2" hereinafter). The device 2 is constructed by the tunneling oxide layer formed on the silicon substrate and having the thickness of 48 angstroms, a silicon nitride layer having a thickness of 70 angstroms, the silicon oxide dielectric layer having the thickness of 90 angstroms, and the doped polysilicon gate. During the programming operation, the −FN programming is conducted by applying the −18V voltage to the doped polysilicon gate.

It is shown in FIG. 4 that as the −FN programming operations of the device 1 and the device 2 are conducted, $\Delta V_T$ of the device 1 is apparently larger than $\Delta V_T$ of the device 2 during a time period longer than $10^{-6}$ seconds but shorter than $10^{-2}$ seconds. Moreover, it is indicated in FIG. 4 that during the −FN programming operations, a time required by the device 1 is obviously shorter than that required by the device 2 when the same $\Delta V_T$ (larger than 2V but smaller then 4V) is reached. Accordingly, the SSRO layer serving as the charge trapping layer in the present invention is capable of increasing both the number of the charges captured by the charge trapping layer and the capturing speed achieved thereby.

Figure 5:
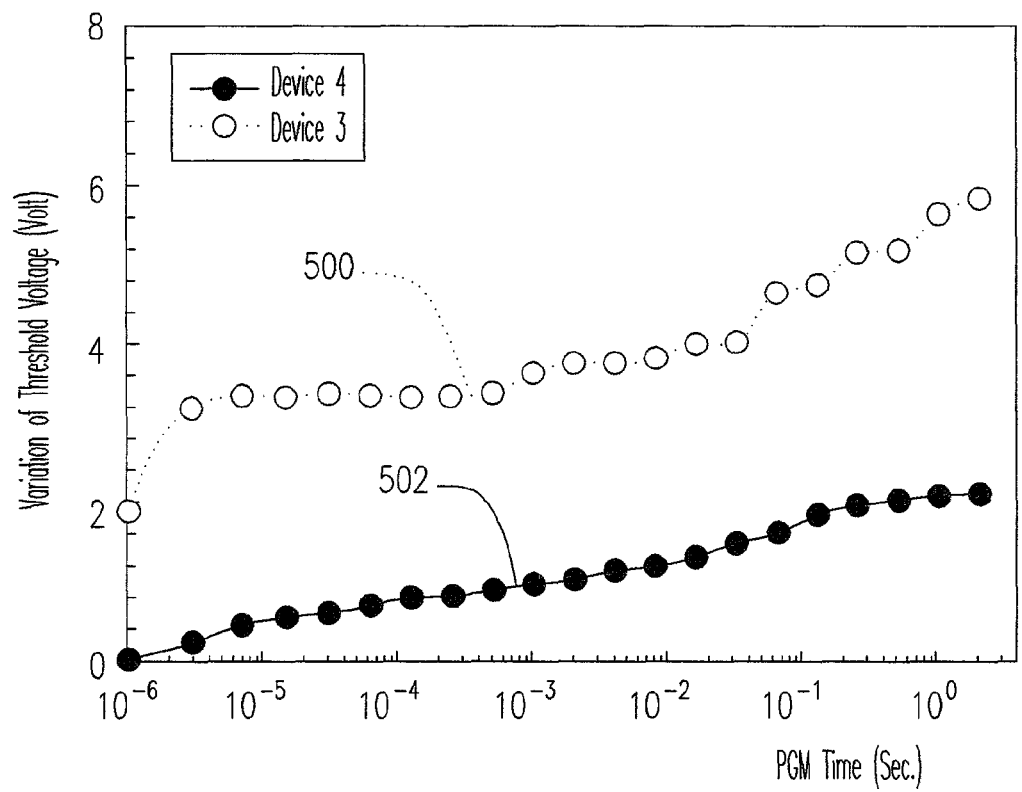
FIG. 5 is a curve diagram illustrating the experimental results with respect to the relation between the PGM time and the corresponding $\Delta V_T$ in a silicon-rich oxide (SRO) device and that of the SSRO device according to the present invention.

FIG. 5 is a curve diagram illustrating experimental results with respect to the relation between the PGM time and the corresponding $\Delta V_T$ in a silicon-rich oxide (SRO) device and that of a SSRO device according to the present invention.

A curve 500 represents the relation between the PGM time and the corresponding $\Delta V_T$ in the SSRO device (referring to as "device 3" hereinafter). The device 3 is constituted by the tunneling oxide layer formed on the silicon substrate and having the thickness of 48 angstroms, the SSRO layer having the thickness of 100 angstroms and the refractive index at 248 nm wave length of 1.7, the silicon oxide dielectric layer having the thickness of 90 angstroms, and the doped polysilicon gate. During the programming operation, the −FN programming is conducted by applying the −18V voltage to the doped polysilicon gate.

A curve 502 represents the relation between the PGM time and the corresponding $\Delta V_T$ in the SRO device (referring to as "device 4" hereinafter). The device 4 is constituted by the tunneling oxide layer formed on the silicon substrate and having the thickness of 48 angstroms, the SRO layer having the thickness of 100 angstroms and the refractive index at 248 nm wave length of 1.56, the silicon oxide dielectric layer having the thickness of 90 angstroms, and the doped polysilicon gate. During the programming operation, the −FN programming is conducted by applying the −18V voltage to the doped polysilicon gate.

It is shown in FIG. 5 that as the −FN programming operations of the device 3 and the device 4 are conducted, $\Delta V_T$ of the device 3 is apparently larger than $\Delta V_T$ of the device 4. Moreover, it is indicated in FIG. 5 that during the −FN programming operations, a time required by the device 3 is obviously shorter than that required by the device 4 when the same $\Delta V_T$ is reached.

To sum up, the SSRO layer is utilized as the charge trapping layer of the non-volatile memory cell in the present invention. Thereby, the number of the charges captured by the charge trapping layer can be increased, and the capturing speed achieved by the charge trapping layer can be raised.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A super-silicon-rich oxide (SSRO) non-volatile memory cell, comprising:
   a) a gate conductive layer disposed on a substrate;
   b) a source/drain region disposed in the substrate at respective sides of the gate conductive layer;
   c) a tunneling dielectric layer disposed between the gate conductive layer and the substrate;
   d) a SSRO layer serving as a charge trapping layer disposed between the gate conductive layer and the tunneling dielectric layer; wherein a refractive index at 248 nm wave length of the SSRO layer ranges from 1.7 to 2; wherein the tunneling dielectric layer comprises a bottom oxide layer, a nitride layer and a top oxide layer from bottom to top formed between the SSRO layer and the substrate; and
   e) an upper-dielectric layer disposed between the gate conductive layer and the SSRO layer.

2. The SSRO non-volatile memory cell as claimed in claim 1, wherein a material of the upper-dielectric layer comprises silicon oxide.

3. The SSRO non-volatile memory cell as claimed in claim 1, wherein the tunneling dielectric layer is a tunneling oxide layer.

4. The SSRO non-volatile memory cell as claimed in claim 3, wherein a thickness of the tunneling oxide layer ranges from 40 angstroms to 50 angstroms.

5. The SSRO non-volatile memory cell as claimed in claim 1, wherein a thickness of the bottom oxide layer is less than 20 angstroms.

6. The SSRO non-volatile memory cell as claimed in claim 1, wherein a thickness of the bottom oxide layer ranges from 5 angstroms to 20 angstroms.

7. The SSRO non-volatile memory cell as claimed in claim 1, wherein a thickness of the bottom oxide layer is less than 15 angstroms.

8. The SSRO non-volatile memory cell as claimed in claim 1, wherein a thickness of the nitride layer is less than 20 angstroms.

9. The SSRO non-volatile memory cell as claimed in claim 1, wherein a thickness of the nitride layer ranges from 10 angstroms to 20 angstroms.

10. The SSRO non-volatile memory cell as claimed in claim 1, wherein a thickness of the top oxide layer is less than 20 angstroms.

11. The SSRO non-volatile memory cell as claimed in claim 1, wherein a thickness of the top oxide layer ranges from 15 angstroms to 20 angstroms.

12. The SSRO non-volatile memory cell as claimed in claim 1, wherein a thickness of the SSRO layer ranges from 80 angstroms to 120 angstroms.

13. The SSRO non-volatile memory cell as claimed in claim 1, wherein a thickness of the upper-dielectric layer ranges from 70 angstroms to 110 angstroms.

14. A cluster non-volatile memory cell, comprising:
   a) a gate conductive layer disposed on a substrate;
   b) a source/drain region disposed in the substrate at respective sides of the gate conductive layer;
   c) a tunneling dielectric layer disposed between the gate conductive layer and the substrate;
   d) a charge trapping layer disposed between the gate conductive layer and the tunneling dielectric layer; wherein the charge trapping layer comprises an insulating layer and a plurality of cluster disposed in the insulating layer; wherein a refractive index at 248 nm wave length of the charge trapping layer ranges from 1.7 to 2; wherein the tunneling dielectric layer comprises a bottom oxide layer, a nitride layer and a top oxide layer from bottom to top formed between the charge trapping layer and the substrate; and e) an upper-dielectric layer disposed between the gate conductive layer and the charge trapping layer.

15. The cluster non-volatile memory cell as claimed in claim 14, wherein a material of the insulating layer comprises silicon oxide, and the clusters are made of silicon atoms.

16. The cluster non-volatile memory cell as claimed in claim 14, wherein a material of the upper-dielectric layer comprises silicon oxide.

17. The cluster non-volatile memory cell as claimed in claim 14, wherein the tunneling dielectric layer is a tunneling oxide layer.

18. The cluster non-volatile memory cell as claimed in claim 17, wherein a thickness of the tunneling oxide layer ranges from 40 angstroms to 50 angstroms.

19. The cluster non-volatile memory cell as claimed in claim 17, wherein a thickness of the bottom oxide layer is less than 20 angstroms.

20. The cluster non-volatile memory cell as claimed in claim 17, wherein a thickness of the bottom oxide layer ranges from 5 angstroms to 20 angstroms.

21. The cluster non-volatile memory cell as claimed in claim 17, wherein a thickness of the bottom oxide layer is less than 15 angstroms.

22. The cluster non-volatile memory cell as claimed in claim 17, wherein a thickness of the nitride layer is less than 20 angstroms.

23. The cluster non-volatile memory cell as claimed in claim 17, wherein a thickness of the nitride layer ranges from 10 angstroms to 20 angstroms.

24. The cluster non-volatile memory cell as claimed in claim 17, wherein a thickness of the top oxide layer is less than 20 angstroms.

25. The cluster non-volatile memory cell as claimed in claim 17, wherein a thickness of the top oxide layer ranges from 15 angstroms to 20 angstroms.

26. The cluster non-volatile memory cell as claimed in claim 14, wherein a thickness of the SSRO layer ranges from 80 angstroms to 120 angstroms.

27. The cluster non-volatile memory cell as claimed in claim 14, wherein a thickness of the upper-dielectric layer ranges from 70 angstroms to 110 angstroms.

* * * * *